(12) United States Patent
Choi et al.

(10) Patent No.: US 6,635,404 B1
(45) Date of Patent: Oct. 21, 2003

(54) STRUCTURE AND PROCESS METHOD OF GAMMA GATE FOR HEMT

(75) Inventors: Sang Soo Choi, Taejon (KR); Jim Hee Lee, Taejon (KR); Doh Hoon Kim, Taejon (KR); Kag Hyeon Lee, Taejon (KR); Hai Bin Chung, Taejon (KR); Dae Yong Kim, Taejon (KR)

(73) Assignee: Electronics and Telecommunications Research Institute, Taejon (KR)

( * ) Notice: Subject to any disclaimer, the term of this patent is extended or adjusted under 35 U.S.C. 154(b) by 0 days.

(21) Appl. No.: 09/498,322

(22) Filed: Feb. 4, 2000

(30) Foreign Application Priority Data

Nov. 30, 1999 (KR) .......................... 1999-53887

(51) Int. Cl.⁷ ........................... G03F 7/00; G03F 7/039; H01L 21/338
(52) U.S. Cl. ................... 430/311; 430/313; 430/326; 430/328; 430/330
(58) Field of Search ................. 430/311, 313, 430/330, 326, 328

(56) References Cited

U.S. PATENT DOCUMENTS

| | | | |
|---|---|---|---|
| 4,700,462 A | | 10/1987 | Beaubien et al. ........... 437/187 |
| 5,071,733 A | * | 12/1991 | Uekita et al. ............... 430/326 |
| 5,334,542 A | | 8/1994 | Saito et al. .................. 437/40 |
| 5,516,626 A | * | 5/1996 | Ohmi et al. ................. 430/328 |
| 5,766,967 A | * | 6/1998 | Lai et al. .................... 437/415 |
| 5,930,610 A | * | 7/1999 | Lee ............................. 438/182 |
| 5,940,697 A | * | 8/1999 | Yoo et al. .................... 438/182 |
| 6,015,991 A | * | 1/2000 | Wheeler et al. ............ 257/336 |
| 6,159,781 A | * | 12/2000 | Pan et al. .................... 438/167 |

OTHER PUBLICATIONS

Sewell et al., "Single–Cycle Lithography Process for Both Large and Sub–Half–Micron Features," *SPIE*, 1671:177–182, 1992.
Tan et al., "E–beam Direct Write of Rectangular and Mushroom Gates for GaAs FETs," *SPIE*, 1263:217–227,1990.
Choi et al., "Optimization of Electron Beam Lithography for Super Low Noise HEMTs," *SPIE*, 2723:372–382, 1996.

* cited by examiner

*Primary Examiner*—Janet Baxter
*Assistant Examiner*—Amanda C. Walke
(74) *Attorney, Agent, or Firm*—Seed IP Law Group PLLC (57) ABSTRACT

A method of fabricating a resist pattern for a gamma gate of high electron mobility transistors of gallium arsenide (GaAs) elements for high-speed data communication with low noise is disclosed. The method of fabricating the gamma gate according to the present invention includes the steps of forming a first resist pattern by coating a first resist on a GaAs substrate, and exposing, developing and baking the coated first resist, sequentially; and forming a second resist pattern by coating a second resist on the GaAs substrate and the first resist pattern. and exposing, developing and baking the coated second resist, sequentially. A portion of the GaAs substrate covered by the first and the second resist patterns defines a region that a footprint of the gamma gate is formed, and a portion of the GaAs substrate which is covered by the first resist pattern, but not covered by the second resist pattern defines a region that a head of the gamma gate is formed.

6 Claims, 7 Drawing Sheets

FIG. 4B

STRUCTURE AND PROCESS METHOD OF GAMMA GATE FOR HEMT

TECHNICAL FIELD

The present invention relates to high electron mobility transistors (hereinafter, HEMTs) of gallium arsenide (GaAs) elements for high-speed data communication with low noise. More particularly, the present invention relates to a method of fabricating resist patterns in order to form a gamma gate for HEMTs and a method of forming a gamma gate using such resist patterns and a structure thereof.

BACKGROUND OF THE INVENTION

A gamma gate is applied to HEMTs with a purpose of the reduction of gate resistance and element noise.

Figure 1A:
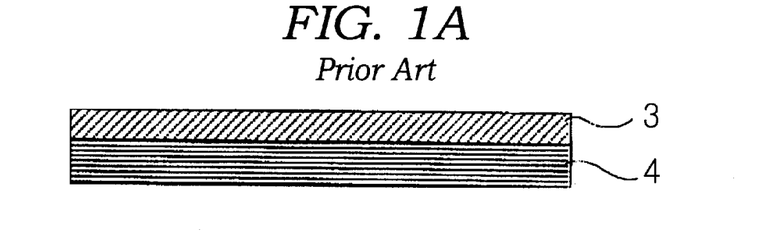
FIGS. 1A to 1G are cross-sectional views illustrating procedures for forming a gamma gate using electron-beam lithography in accordance with a related art.
Figure 1B:
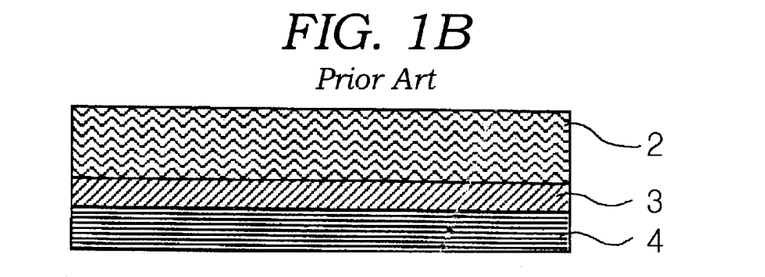
Figure 1C:
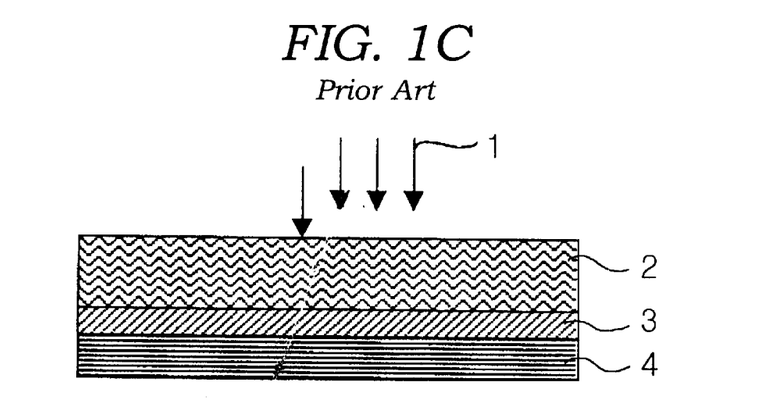
Figure 1D:
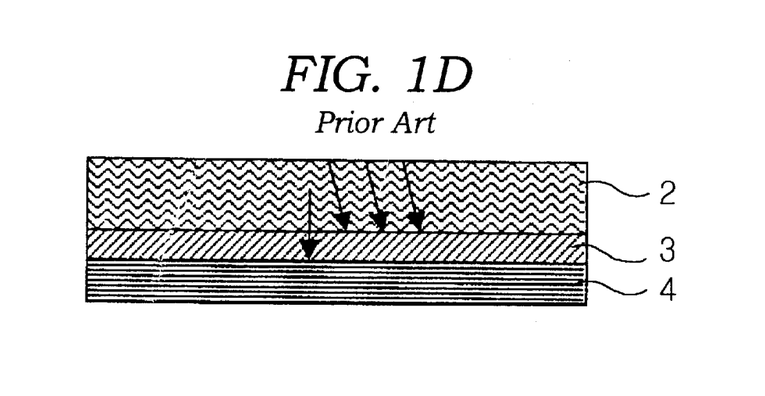
Figure 1E:
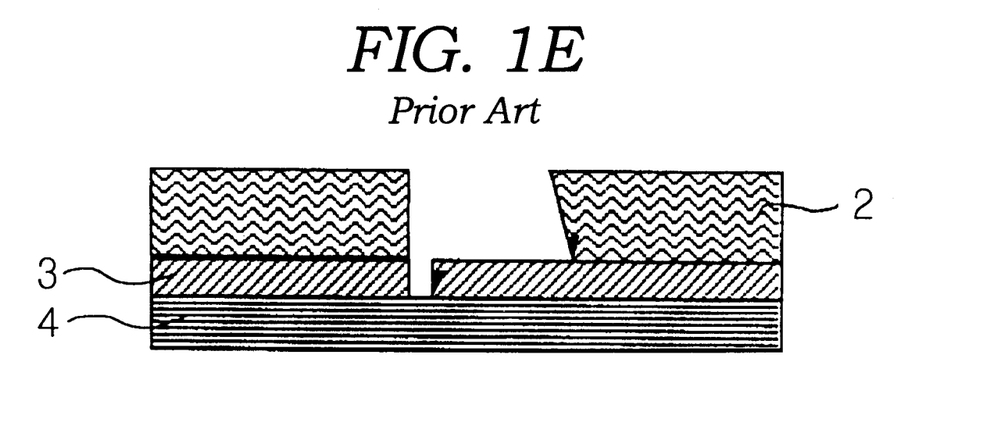
Figure 1F:
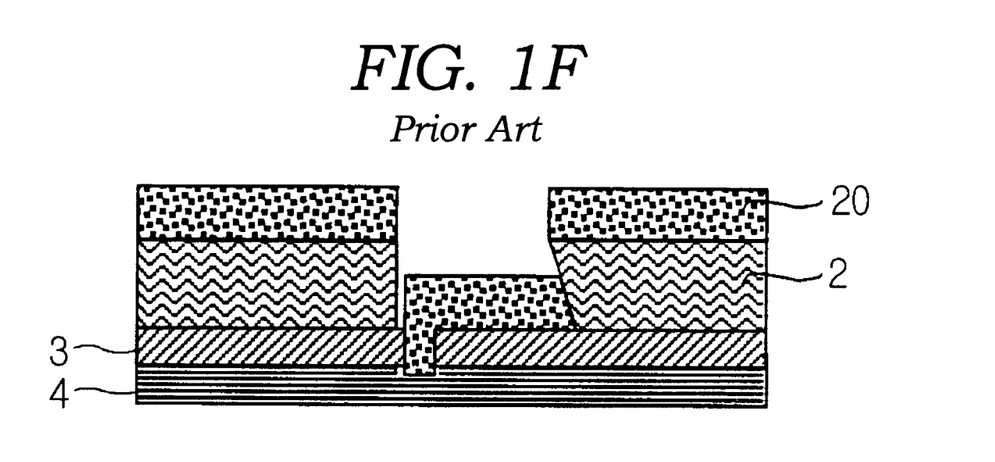
Figure 1G:
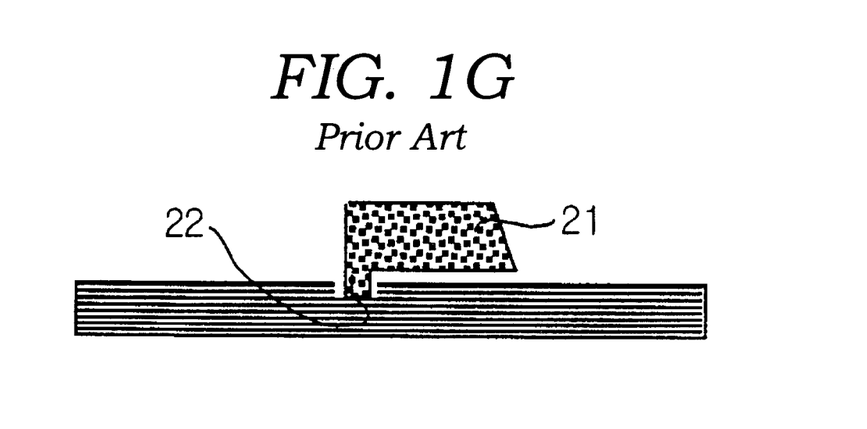

In related arts, it has been already known a method of forming two-layer or three-layer resist structure and a method of forming a gate based on the sensitivity difference between the resist layers. As shown in FIG. 1G, such gate formed according to the related art has a head wider than a footprint. According to the shape of the gate, it is called a Γ-gate or Γ-gate. The technique of forming such related art gate applies electron-beam lithography in order to satisfy a fine design-rule.

Now, referring to FIGS. 1A to 1G, a method of forming a related art Γ-gate will be described. First, a PMMA resist 3 having a thickness of 0.15–0.2 μm is coated on a GaAs wafer 4 (FIG. 1A). A P(MMA/MAA) resist 2, which has more greater sensitivity than the PMMA resist 3 and which has a thickness of 0.6 μm is coated on the coated PMMA resist 3 (FIG. 1B). Using a dose converting method, the coated resists 2 and 3 are exposed to electron beams 1 by means of an electron beam lithography process (FIG. 1C). Then, electron beams are transmitted to the inside of the two resists 2 and 3 (FIG. 1D). A pattern for forming a Γ-gate is formed by developing the resists 2 and 3 (FIG. 1E). A gate metal film 20 is deposited on a resultant structure (FIG. 1F). Then, the resists 2 and 3 are removed to thereby form a gamma gate having a head 21 and a footprint 22 (FIG. 1G).

However, since the method of the related art uses the electron-beam lithography, there are such problems as, for example, the reduction of productivity and requirements of high-priced equipment.

Thus, a method of forming the gamma gate without using the electron-beam lithography has been keenly required.

SUMMARY OF THE INVENTION

Accordingly, the present invention is directed to a method of fabricating a gamma gate of HEMT capable of obviating the problems due to limitations and disadvantages of the related art.

An object of the present invention is to provide a method of forming a resist pattern for forming a gamma gate having a fine gate footprint of about 0.1 μm and a gate head of a certain size regardless of any kinds of exposing sources or equipments. Particularly, the present invention can provide a gamma gate having a fine resolution of 0.1 μm or the equivalent, which cannot be achieved by conventional photolithography using contact or proximity type exposing source of I-line or G-line and a stepper.

Another object of the present invention is to provide a method of fabricating a gamma gate which is capable of remarkably reducing an element noise of HEMT.

To achieve these and other advantages, a method of fabricating a gamma gate according to the present invention comprises the steps of depositing a first resist layer on a GaAs substrate; forming a first resist pattern on the GaAs substrate by exposing, developing and baking the first resist layer, sequentially; depositing a second resist layer on the first resist pattern and the first resist layer; forming a second resist pattern so that a marginal portion of the second resist pattern overlaps the first resist pattern, by exposing, developing and baking the second resist layer, sequentially; etching the GaAs substrate using the first and second resist layers as a mask to form a recess on the GaAs substrate; depositing a metal layer on the resultant structure; and removing the first and second resist layers to form the gamma gate with a head and a footprint, wherein the footprint of the gamma gate is formed in the marginal portion of the second resist pattern overlapping the first resist pattern and the width of the overlapped portion defines the size of the footprint of the gamma gate, and wherein the head of the gamma gate is formed on the first resist layer in a residual portion of the second resist pattern other than the overlapped portion.

Preferably, the baking process during the step of forming the first resist pattern is conducted with application of ultraviolet rays at a temperature of above 120° C.

More preferably, the developing process during the step of forming the second resist pattern is conducted at a negative slope of 89° or less.

In another aspect of the present invention, a method of fabricating a gamma gate comprises the steps of depositing a first insulation layer on a GaAs substrate; depositing a first resist layer on the first insulation layer; forming a first resist pattern on the first insulation layer by exposing, developing and baking the first resist layer, sequentially; etching the first insulation layer using the first resist pattern as a mask and removing the first resist layer to form an insulation layer pattern; depositing a second resist layer on the insulation layer pattern and the first insulation layer; forming a second resist pattern by exposing, developing and baking the second resist layer, sequentially, so that a marginal portion of the second resist pattern overlaps the insulation layer pattern; etching the GaAs substrate using the first insulation layer and the second resist layer as a mask to form a recess on the GaAs substrate; depositing a metal layer on the resultant structure; removing the second resist pattern to form the gamma gate with a head and a footprint; and depositing a second insulation layer on the resultant structure so that the second insulation layer surrounds the gamma gate, wherein the footprint of the gamma gate is formed in the marginal portion of the second resist pattern overlapping the insulation layer pattern and the width of the overlapped portion defines the size of the footprint of the gamma gate, and wherein the head of the gamma gate is formed on the first insulation layer in a residual portion of the second resist pattern other than the overlapped portion.

Preferably, the baking process during the step of forming the first resist pattern is conducted with application of ultraviolet rays at a temperature of above 120° C.

More preferably, the developing process during the step of forming the second resist pattern is conducted at a negative slope of 89° or less.

Additionally, a structure of a gamma gate is characterized in that an insulation layer surrounds surrounding the gamma gate; the gamma gate has the lower part and the fore; and a portion of the insulation layer located on the lower part of the head of the gamma gate is different from a portion of the insulation layer surrounding the head of the gamma gate in thickness.

BRIEF DESCRIPTION OF THE DRAWINGS

The embodiments of the present invention will be explained with reference to the accompanying drawings, in which.

DETAILED DESCRIPTION OF THE INVENTION

Referring to FIGS. 2A to 4B, the present invention will be explained in detail in the following.

FIG. 2A to FIG. 2E are a series of cross-sectional views illustrating a method of forming a gamma gate in accordance with an embodiment of the present invention.

Figure 2A:
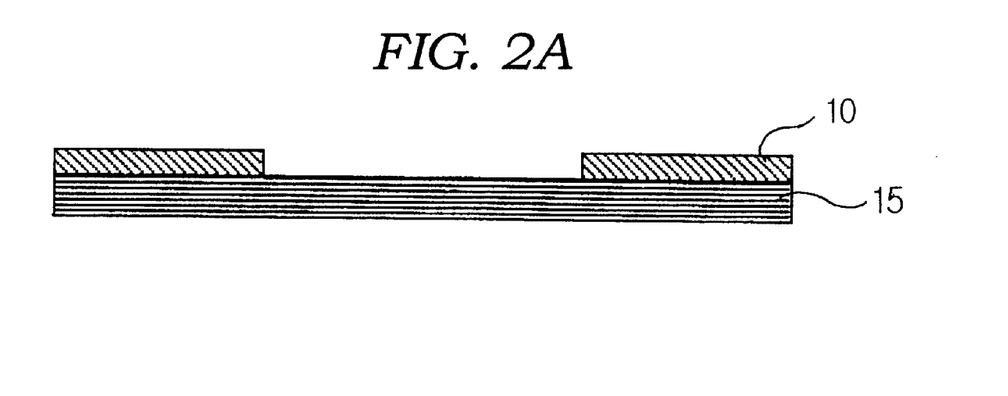
FIGS. 2A to 2E are cross-sectional views illustrating procedures for forming a gamma gate in accordance with an embodiment of the present invention.
Figure 2B:
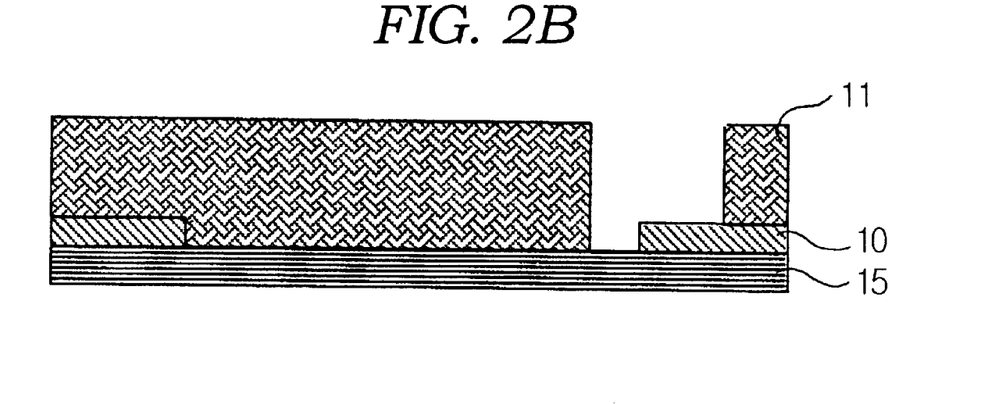
Figure 2C:
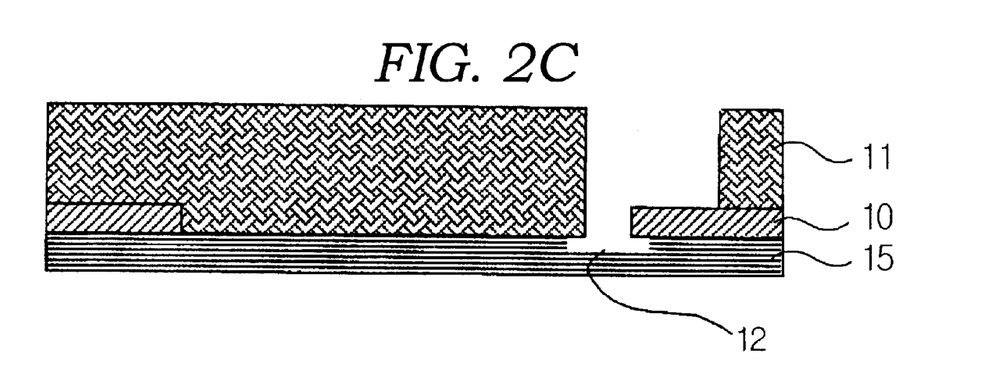
Figure 2D:
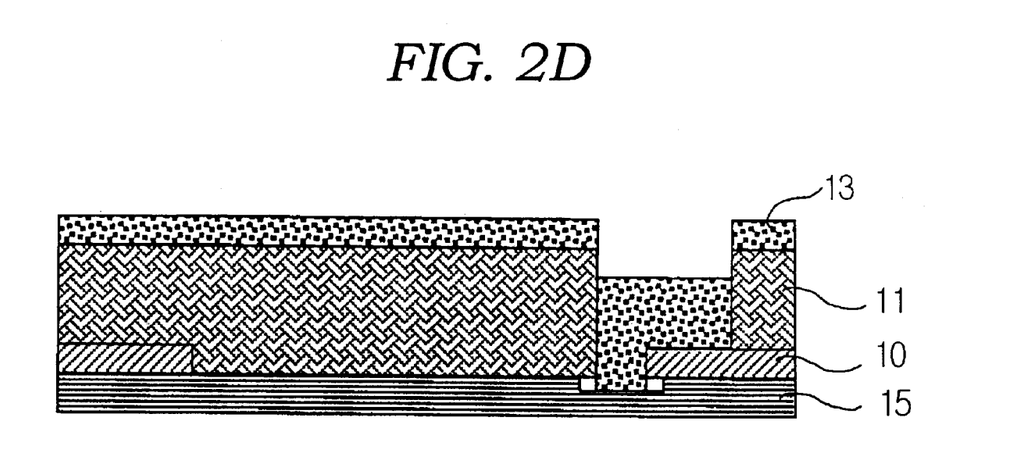
Figure 2E:
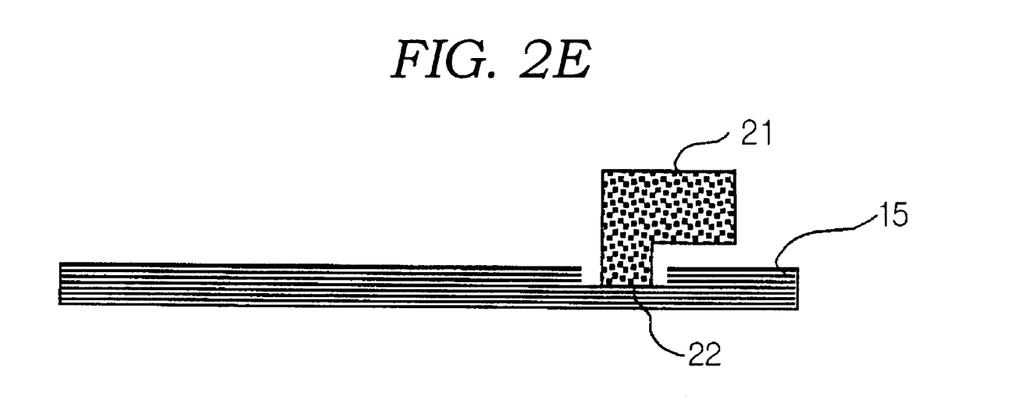

A first resist corresponding to an exposing source is coated on a GaAs substrate 15. Then the first coated resist is exposed, developed and baked to form a first resist pattern 10 (FIG. 2A). At this time, baking is conducted at above 120° C and it is required to irradiate by UV rays so that the first resist pattern should not flow down. Next, a second resist, which may be the same as the first resist or different one from the first resist, is coated. Then the second resist is exposed, developed and baked to form a second resist pattern 11 (FIG. 2B). At this time, it is preferable that a shape-converted resist is used so that the second resist pattern has a negative cross-section. Also, it is preferable that the second resist is developed at a negative slope of 89° and less. A recess 12 is formed by etching the substrate 15 using the first and the second resist patterns 10, 11 as a mask (FIG. 2C). A metal layer 13 for gate is deposited on a resultant structure (FIG. 2D). Finally, a residual portion except for a portion of the metal layer 13 on which a gamma gate is formed and the first and the second resist patterns 10, 11 are removed to form the gamma gate having a head 21 and a footprint 22 (FIG. 2E).

FIG. 3A to FIG. 3G are a series of cross-sectional views illustrating a method of forming a gamma gate in accordance with another embodiment of the present invention.

Figure 3A:
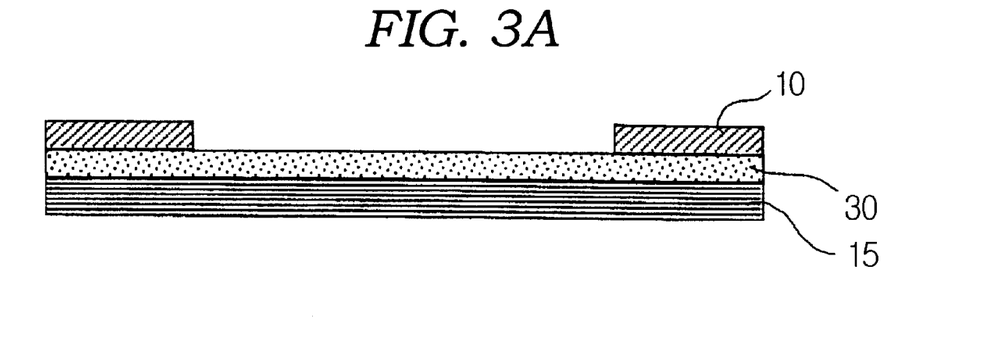
FIGS. 3A to 3G are cross-sectional views illustrating procedures for forming a gamma gate in accordance with another embodiment of the present invention.
Figure 3B:
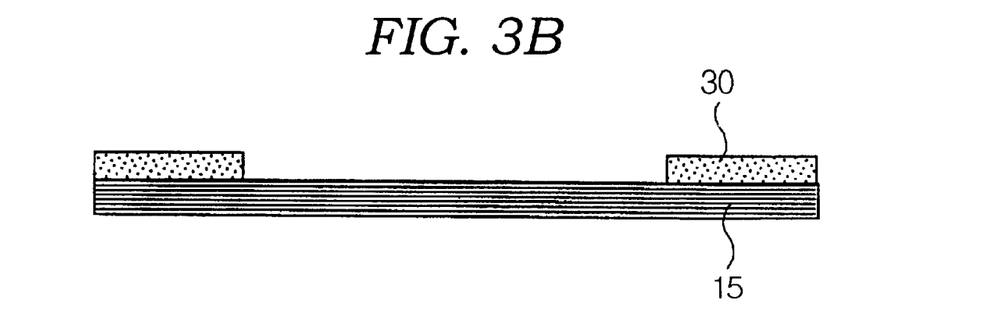
Figures 3C, 3D:
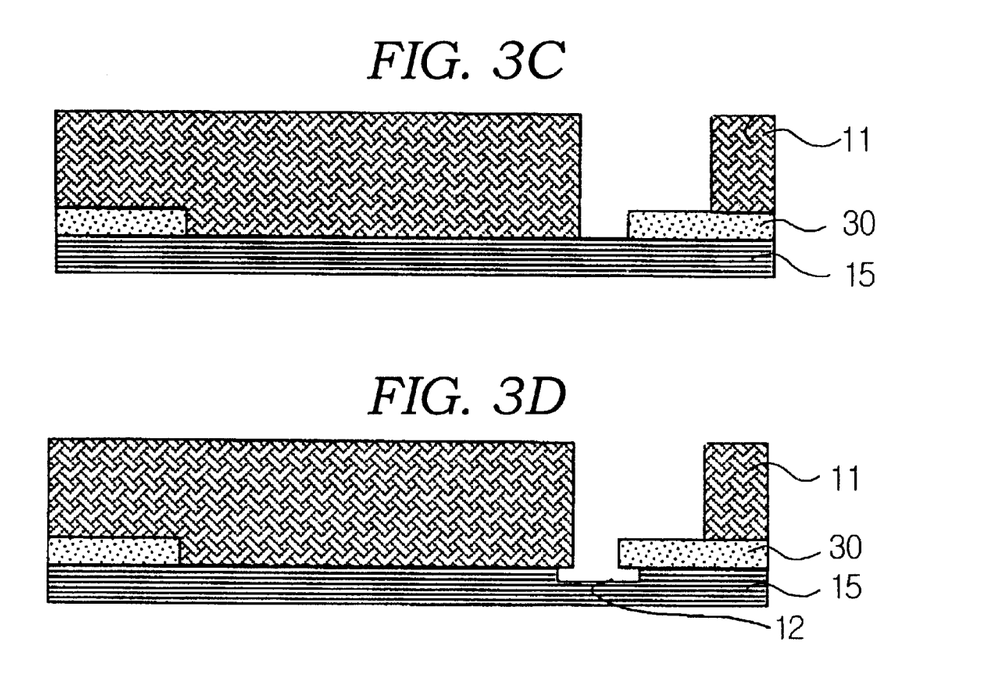
Figure 3E:
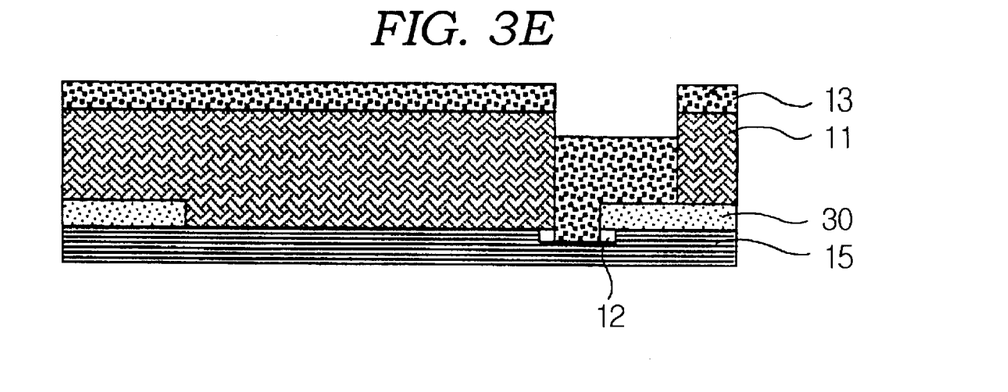
Figure 3F:
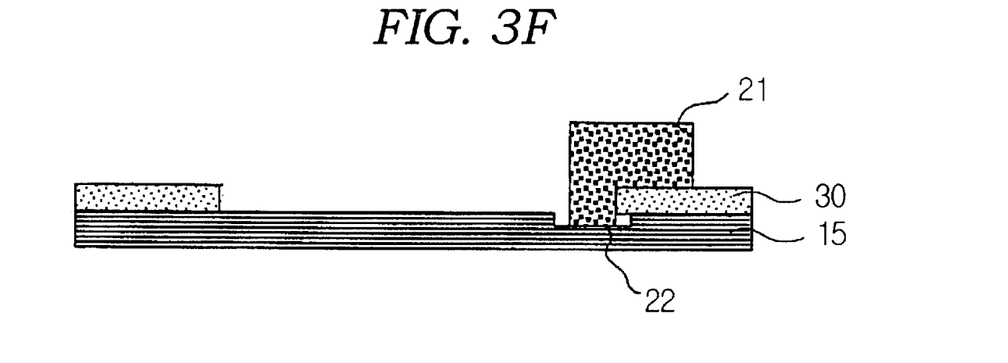
Figure 3G:
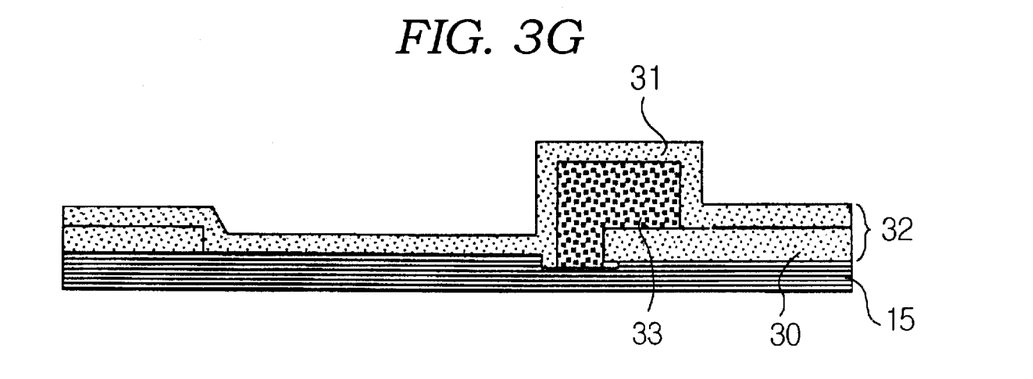

First, an insulation layer 30 is deposited on a GaAs substrate 15 and a first resist is coated thereon. Then, the first resist is exposed and developed to form a first resist pattern 10 (FIG. 3A). Herein, the insulation layer 30 may include a silicon nitride (SixNy) or silicon oxide (SixOy). Next, using the first resist pattern 10 as a mask, the insulation layer 30 is etched to form an insulation layer pattern (FIG. 3B). At this time, either a wet etching or a dry etching may be used. Sequentially, a second resist is coated, exposed and developed to form a second resist pattern 11 (FIG. 3C). Thereby a region in which a gamma gate is formed and its shape are defined. At this time, it is preferable that the second resist is developed at a negative slope of 89° and less. Also, a shape-converted resist or a high-contrast resist is preferably used. Thereby a gate metal to be deposited in the next step may be easily lift-off. Next, using the insulation layer pattern and the second resist pattern as a mask, the substrate is etched to form a recess 12 (FIG. 3D). A metal layer 13 for gate is deposited on a resultant structure (FIG. 3E). By conducting a lift-off procedure, a residual portion except for a portion of the metal layer 13 on which a gamma gate is formed and the second resist pattern are removed to thereby form the gamma gate having a head 21 and a footprint 22 (FIG. 3F). An insulation layer 31 is deposited on a resultant structure so that the insulation layer 31 covers the gamma gate 33 (FIG. 3G).

In the final structure, a portion of the insulation layer "32", at which the insulation layer 30 formed under the head of the gamma gate and the insulation layer 31 deposited finally are met, is different from the insulation layer "30" in thickness.

Figure 4A:
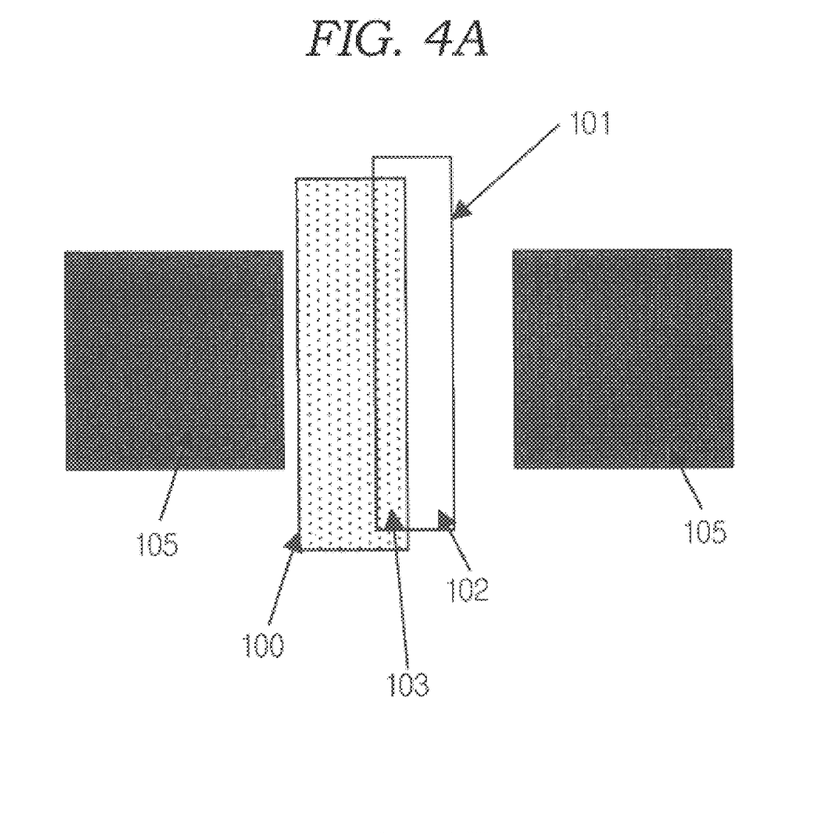
FIGS. 4A to 4B are a plane view of an exposing pattern used in formation of a gamma gate in accordance with the present invention and a cross-sectional view of the corresponding gamma gate, respectively.
Figure 4B:
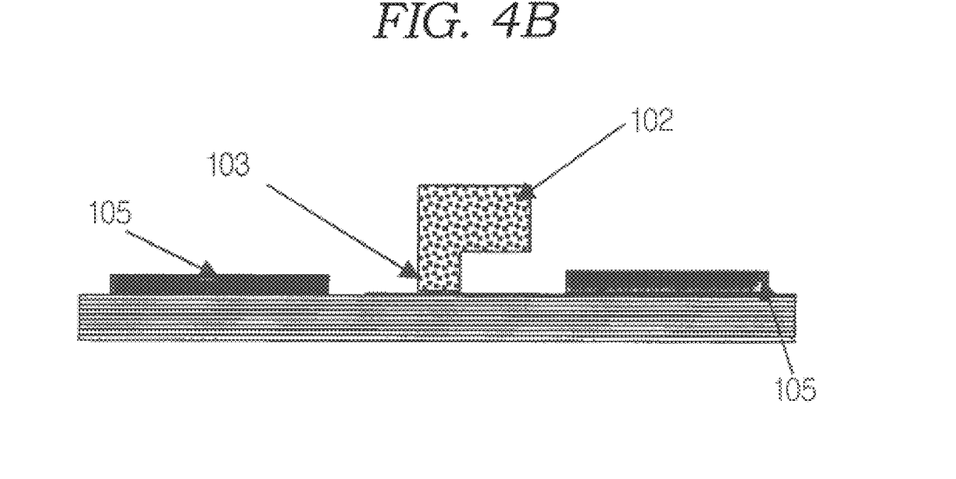

FIG. 4A is a plane view of an exposing pattern used in formation of a gamma gate in accordance with the present invention and FIG. 4B is a cross-sectional view of the gamma gate formed by the pattern of FIG. 4A.

Numeric 100 indicates a pattern of the region removed by exposing the resist when the first resist pattern is formed, and Numeric 101 indicates a pattern of the region removed by exposing the resist when the second resist pattern is formed. The patterns 100 and 101 are named exposing patterns. Herein, a portion 103 where the two exposing patterns are overlapped defines a region where the footprint of the gamma gate is formed and the residual portion 102 of the pattern 101 defines a region where the head of the gamma gate is formed. Numeric 105 indicates a contact electrode predeposited on the substrate.

By adjusting the width of the overlapped portion 103, the size of the footprint of the gamma gate can be adjusted and by adjusting the width of the pattern 102, the size of the head of the gamma gate can be adjusted.

Eventually, in accordance with the present invention, the precision of the resist pattern can be controlled based on the array precision of exposing equipment. Thus, it is possible that the footprint of the gamma gate is formed with a very fine design-rule regardless of the resolution of exposing sources. Additionally, it is also possible that the head of the gamma gate is sufficiently increased in area based on how to design of the mask pattern, thereby remarkably decreasing element noise.

By using an optical exposing method or another exposing method and a certain exposing source as well as an electron-beam lithography having good resolution, it is possible to form a resist pattern for forming a gamma gate. The footprint of the gamma gate of 0.1 $\mu$m or the equivalent can be formed by using a certain exposing source, e.g. I-line (365 nm), KrF (248 nm), ArF (193 nm) electron-beam, X-ray or the like, and a certain exposing method, e.g. stepper, proximity exposing equipment, contact exposing equipment or the like. Especially, in case that an optical method without resolution of 0.1 $\mu$m or the equivalent is applied to the present invention, it is possible to obtain very useful results.

As described above, according to the present invention, a resist pattern for forming a gamma gate of HEMT may be fabricated regardless of any kinds of exposing sources or equipment or exposing methods. And, the gamma gate of HEMT may be formed with a certain exposing source and a certain exposing equipment based on how to design the resist pattern. Also, it is possible to sufficiently increase the area of the head of the gamma gate, thereby fabricating a HEMT with remarkably decreased element noise.

Although representative embodiments of the present invention have been disclosed for illustrative purposes, those who are skilled in the art will appreciate that various modifications, additions and substitutions are possible without departing from the scope and spirit of the present invention as defined in the accompanying claims and the equivalents thereof.

What we claim:

1. A method of fabricating a gamma gate of a high-speed and low-noise HEMT comprising the steps of:

depositing a first resist layer on a GaAs substrate;

forming a first resist pattern on the GaAs substrate by exposing, developing and baking the first resist layer, sequentially;

depositing a second resist layer on the first resist pattern and the first resist layer;

forming a second resist pattern so that a marginal portion of the second resist pattern overlaps the first resist pattern, by exposing, developing the second resist pattern at a negative slope of 89° or less, and baking the second resist layer, sequentially;

etching the GaAs substrate using the first and second resist layers as a mask to form a recess on the GaAs substrate;

depositing a metal layer on the resultant structure; and removing the first and second resist layers to form the gamma gate with a head and a footprint, wherein the footprint of the gamma gate is formed in the marginal portion of the second resist pattern overlapping the first resist pattern and the width of the overlapped portion defines the size of the footprint of the gamma gate, and wherein the head of the gamma gate is formed on the first resist layer in a residual portion of the second resist pattern other than the overlapped portion.

2. The method of fabricating a gamma gate of claim 1, wherein the baking process during the step of forming the first resist pattern is conducted with application of ultraviolet rays at a temperature of above 120° C.

3. A method of fabricating a gamma gate of a high-speed and low-noise HEMT comprising the steps of:

depositing a first insulation layer on a GaAs substrate;

depositing a first resist layer on the first insulation layer;

forming a first resist pattern on the first insulation layer by exposing, developing and baking the first resist layer, sequentially;

etching the first insulation layer using the first resist pattern as a mask and removing the first resist layer to form an insulation layer pattern;

depositing a second resist layer on the insulation layer pattern and the first insulation layer;

forming a second resist pattern by exposing, developing the second resist pattern at a negative slope of 89° or less, and baking the second resist layer, sequentially, so that a marginal portion of the second resist pattern overlaps the insulation layer pattern;

etching the GaAs substrate using the first insulation layer and the second resist layer as a mask to form a recess on the GaAs substrate;

depositing a metal layer on the resultant structure;

removing the second resist pattern to form the gamma gate with a head and a footprint; and depositing a second insulation layer on the resultant structure so that the second insulation layer surrounds the gamma gate, wherein the footprint of the gamma gate is formed in the marginal portion of the second resist pattern overlapping the insulation layer pattern and the width of the overlapped portion defines the size of the footprint of the gamma gate, and wherein the head of the gamma gate is formed on the first insulation layer in a residual portion of the second resist pattern other than the overlapped portion.

4. The method of fabricating a gamma gate of claim 3, wherein the baking process during the step of forming the first resist pattern is conducted with application of ultraviolet rays at a temperature of above 120° C.

5. A method of fabricating a gamma gate of a high-speed and low-noise HEMT comprising the steps of:

depositing a first resist layer on a GaAs substrate;

forming a first resist pattern on the GaAs substrate by exposing, developing and baking the first resist pattern with application of ultraviolet rays at a temperature of above 120° C., sequentially;

depositing a second resist layer on the first resist pattern and the first resist layer;

forming a second resist pattern so that a marginal portion of the second resist pattern overlaps the first resist pattern, by exposing, developing the second resist pattern at a negative slope of 89° or less, and baking the second resist layer, sequentially;

etching the GaAs substrate using the first and second resist layers as a mask to form a recess on the GaAs substrate;

depositing a metal layer on the resultant structure; and removing the first and second resist layers to form the gamma gate with a head and a footprint, wherein the footprint of the gamma gate is formed in the marginal portion of the second resist pattern overlapping the first resist pattern and the width of the overlapped portion defines the size of the footprint of the gamma gate, and wherein the head of the gamma gate is formed on the first resist layer in a residual portion of the second resist pattern other than the overlapped portion.

6. A method of fabricating a gamma gate of a high-speed and low-noise HEMT comprising the steps of:

depositing a first insulation layer on a GaAs substrate;

depositing a first resist layer on the first insulation layer;

forming a first resist pattern on the first insulation layer by exposing, developing and baking the first resist pattern with application of ultraviolet rays at a temperature of above 120° C., sequentially;

etching the first insulation layer using the first resist pattern as a mask and removing the first resist layer to form an insulation layer pattern;

depositing a second resist layer on the insulation layer pattern and the first insulation layer;

forming a second resist pattern by exposing, developing the second resist pattern at a negative slope of 89° or less, and baking the second resist layer, sequentially, so that a marginal portion of the second resist pattern overlaps the insulation layer pattern;

etching the GaAs substrate using the first insulation layer and the second resist layer as a mask to form a recess on the GaAs substrate;

depositing a metal layer on the resultant structure;

removing the second resist pattern to form the gamma gate with a head and a footprint; and depositing a second insulation layer on the resultant structure so that the second insulation layer surrounds the gamma gate, wherein the footprint of the gamma gate is formed in the marginal portion of the second resist pattern overlapping the insulation layer pattern and the width of the overlapped portion defines the size of the footprint of the gamma gate, and wherein the head of the gamma gate is formed on the first insulation layer in a residual portion of the second resist pattern other than the overlapped portion.

* * * * *